United States Patent
Jeong

(10) Patent No.: US 7,977,142 B2
(45) Date of Patent: Jul. 12, 2011

(54) MANUFACTURING METHOD OF MICROLENS OF CMOS IMAGE SENSOR

(75) Inventor: Eun-Soo Jeong, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 781 days.

(21) Appl. No.: 11/957,865

(22) Filed: Dec. 17, 2007

(65) Prior Publication Data

US 2008/0157245 A1 Jul. 3, 2008

(30) Foreign Application Priority Data

Dec. 28, 2006 (KR) ................. 10-2006-0135922

(51) Int. Cl.
*H01L 21/00* (2006.01)

(52) U.S. Cl. ........................................... 438/70
(58) Field of Classification Search ................. 438/70
See application file for complete search history.

(56) References Cited

U.S. PATENT DOCUMENTS

| 4,553,153 | A | * | 11/1985 | McColgin et al. | ............ 257/435 |
| 6,014,232 | A |   | 1/2000  | Clarke          |                      |
| 6,297,071 | B1 | * | 10/2001 | Wake            | ............... 438/70 |
| 7,547,573 | B2 | * | 6/2009  | Wen et al.      | ............... 438/69 |
| 2004/0082096 | A1 |   | 4/2004 | Yamamoto |  |

FOREIGN PATENT DOCUMENTS

| CN | 1200828 | 12/1998 |
| CN | 1258428 | 6/2000 |
| CN | 1385715 | 12/2002 |
| CN | 1505163 | 6/2004 |
| KR | 10-2003-0039712 | * 5/2003 |

OTHER PUBLICATIONS

Viana, C.E. "TEOS Silicon Oxides Deposition to Low Temperature Applications" Abs. 1005, 206th Meeting, 2004 The Electrochemical Society pp. 1.*

* cited by examiner

*Primary Examiner* — N Drew Richards
*Assistant Examiner* — Grant S Withers
(74) *Attorney, Agent, or Firm* — Sherr & Vaughn, PLLC

(57) ABSTRACT

A method of manufacturing an image sensor having a minimized spatial distance between microlenses to improve integration, and thus, enhance the ability of each microlens to condense light incident.

15 Claims, 3 Drawing Sheets

MANUFACTURING METHOD OF MICROLENS OF CMOS IMAGE SENSOR

The present application claims priority under 35 U.S.C. 119 to Korean Patent Application No. 10-2006-0135922 (filed on Dec. 28, 2006), which is hereby incorporated by reference in its entirety.

BACKGROUND

An image sensor is a semiconductor device that may convert an optical image into an electrical signal. The image sensor may be divided into a charge coupled device (CCD) image sensor and a CMOS image sensor.

The CCD image sensor may have a plurality of metal-oxide-silicon (MOS) capacitors spatially located in very close proximity to each other and which store charger carriers are stored and transferred. The CMOS image sensor may adopt a switching manner including MOS transistors having corresponding pixels. The MOS transistors may be formed using a complementary MOS (CMOS) technique using a control circuit and a signal processing circuit on and/or over a peripheral circuit and then sequentially detecting outputs using them.

The CMOS image sensor may convert information of an object into an electrical signal and can be configured of signal processing chips having a photodiode. One chip may be combined with an amplifier, an analog/digital converter, an internal voltage generator, a timing generator, and a digital logic, etc. to provide advantages such as space, power, and reduced costs.

The CMOS image sensor may have advantages of its ability to be cheaply mass produced and obtain high integration using an etching process of a silicon wafer when compared to the charge coupled device (CCD) image sensor.

The CMOS image sensor can include a microlens, a planarization layer, a color filter array, and a photodiode. The color filter array may divide the incident light into three primary colors (e.g., red, green, and blue) to transfer them into the photodiode. The microlens may perform the function of condensing light into the photodiode. The photo diode may perform the function converting light into an electrical signal.

Figure 1A:
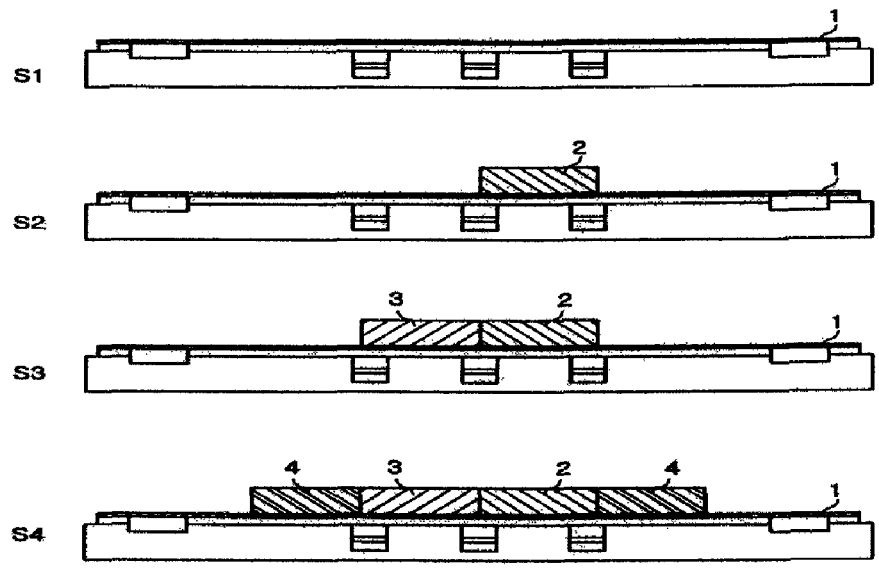

As illustrated in example FIG. 1A, a method of manufacturing a microlens may include in first step (S1) coating thermal resin 1 on and/or over a substrate. In step 2 (S2), blue color filter 2 may then be formed on and/or over thermal resin 1. In step 3 (S3), green color filter 3 may then be formed over thermal resin 1 and adjacent blue color filter 2. In step 4 (S4), red color filters 4 may then be formed on and/or over thermal resin 1 and adjacent blue color filter 2 and green color filter 3.

In step 5 (S5), planarization layer 5 may then be formed on and/or over thermal resin 1 including blue color filter 2, green color filter 3 and red color filters 4 through a planarization process. In step 6 (S6), an oxygen ($O_2$) ashing process may then be performed to remove residue. In step 7 (S7), a plurality of microlenses 7 may then be formed on and/or over planarization layer 5 and spatially correspond to a respective color filter. In step 8 (S8), bleaching (BLCH) process is performed on microlens 7. The step of forming the microlens may serve to lower the viscosity of a photoresist (PR) formed by controlling the focus of an exposure equipment, having excellent transmittance, by way of a reflow process, and manufactures a circular lens by means of weight.

If such a manufacturing method is applied, it may have problems of consistently forming the curved surface for the microlens, and thus, the efficiency of producing CMOS image sensors may be reduced. Moreover, the microlens may have problems of adequately condensing light since the microlenses are spaced a predetermined distance.

SUMMARY

Embodiments relate to a method of manufacturing a CMOS image sensor that can include forming a barrier rib and an oxide film.

Embodiments relate to a method of manufacturing a CMOS image sensor capable of consistently forming a curved microlens surface.

Embodiments relate to a method of manufacturing a CMOS image sensor which minimizes the spatial distance between each microlens to achieve high integration while also increasing the ability to more adequately condense light incident on the same space.

Embodiments relate to a method of manufacturing a CMOS image sensor capable of forming a microlens without a reflow process and a separate exposure process on the microlens.

Embodiments relate to a method of manufacturing an image sensor that can include at least one of the following steps: forming a color filter array over a semiconductor substrate; forming a planarization layer over the color filter array; depositing a first oxide film over the planarization layer; forming a plurality of barrier ribs by exposing and developing the first oxide film; and then forming a microlens between the barrier ribs.

Embodiments relate to a method of manufacturing an image sensor that can include at least one of the following steps: forming a thermal resin over a semiconductor substrate; forming a color filter array over a semiconductor substrate including the thermal resin; forming a planarization layer over the color filter array; forming a plurality of barrier ribs spaced by a gap over the planarization layer; forming a microlens in a respective gap over the planarization layer; and then reducing a spatial gap between respective microlenses.

Embodiments relate to an image sensor that can include at least one of the following: a color filter array formed over a semiconductor substrate; a planarization layer formed over the color filter array; a plurality of barrier ribs spaced by a gap formed over the planarization layer; a microlens formed in a respective gap over the planarization layer; and an oxide film formed over each microlens and the barrier ribs.

DRAWINGS

Figure 1B:
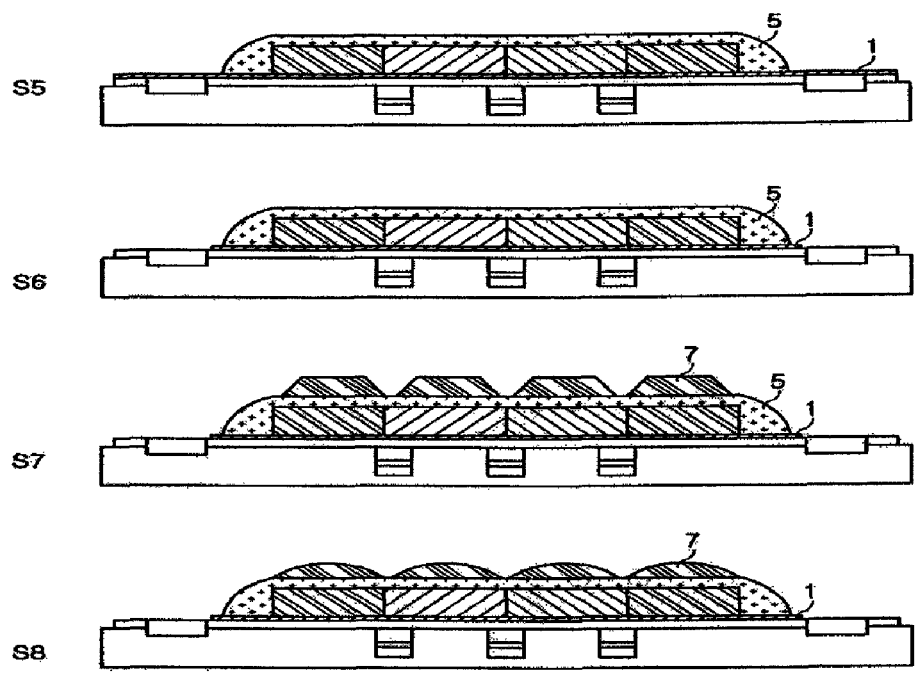

Example FIGS. 1A to 1B illustrate a method of manufacturing a microlens.

Example FIGS. 2 to 6 illustrate a method of manufacturing a microlens, in accordance with embodiments.

DESCRIPTION

Figure 2:
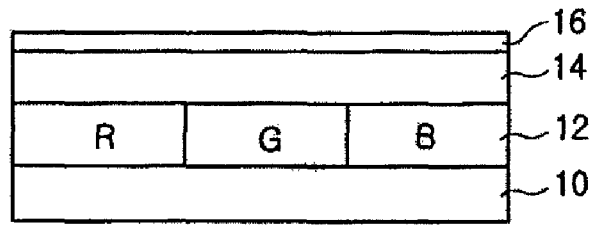

As illustrated in example FIG. 2, a CMOS image sensor in accordance with embodiments can include color filter array (CFA) 12 including a red color filter R, green color filter G and blue color filter B formed on and/or over coated thermal resin 10. Thermal resin 10 can be formed on and/or over semiconductor substrate after necessary constituents such as a optical sensing device region, a gate electrode, an interlayer dielectric layer, a metal wiring, etc., are formed on and/or over a semiconductor substrate.

Planarization layer 14 can then be formed on and/or over color filter array 12 through a planarization process. Oxide film 16 can then be formed on and/or over planarization layer 14. The oxide film 16 can be composed of a low temperature oxide (LTO), which results in the formation of oxide film 16 at a relatively lower temperature as compared to a general oxide film forming process. The low temperature oxide film can be formed through tetra ethyl ortho silicate (TEOS) deposition with a thickness about 500 Å and at a temperature below 180° C. The TEOS deposition herein can include depositing a $SiO_2$ layer using TEOS through a chemical vapor deposition (CVD) process.

Figure 3:
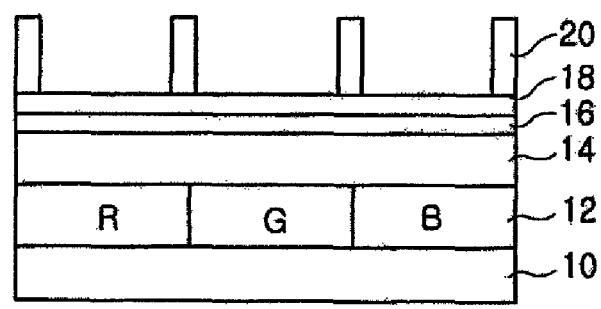

As illustrated in example FIG. 3, exposure and development processes for patterning the oxide film 16 can then be performed. Photoresist pattern 20 for patterning the oxide film 16 at a critical dimension (CD) using krypton fluoride (KrF) can then be formed through exposure and development processes. Antireflection coating (BARC) layer 18 can be formed between oxide film 16 and photoresist pattern 20 in order to prevent diffused reflection.

Figure 4:
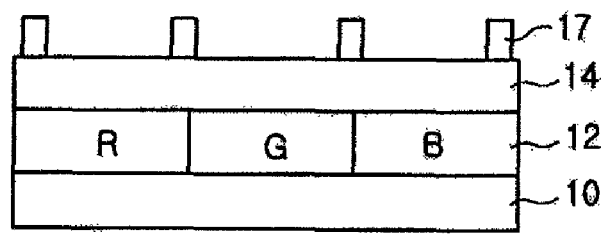

As illustrated in example FIG. 4, barrier rib 17 having a minimum critical dimension can then be formed by etching oxide film 16 using an etching process etching photoresist pattern 20.

Figure 5:
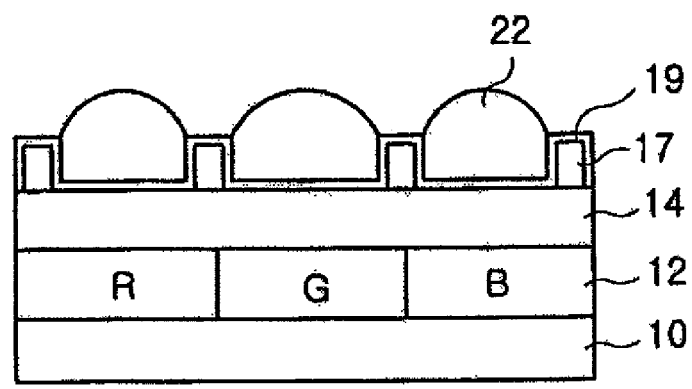

As illustrated in example FIG. 5, hydrophilic solution 19 can then be injected between each barrier rib 17. Hydrophilic solution 19 can be use with deionized (DI) water or resolution enhancement lithography assisted by chemical shrink (RELACS). Hydrophilic solution 19 can be injected between each barrier rib 17 in vapor form. A baking process can then be performed to evaporate hydrophilic solution 19 and the solvent. A photoresist can then be coated between barrier ribs 17 at a constant speed to properly fill the space therebetween. The photoresist can then be subject to a baking process for evaporating hydrophilic solution 19 and the solvent, thereby forming microlens 22.

Figure 6:
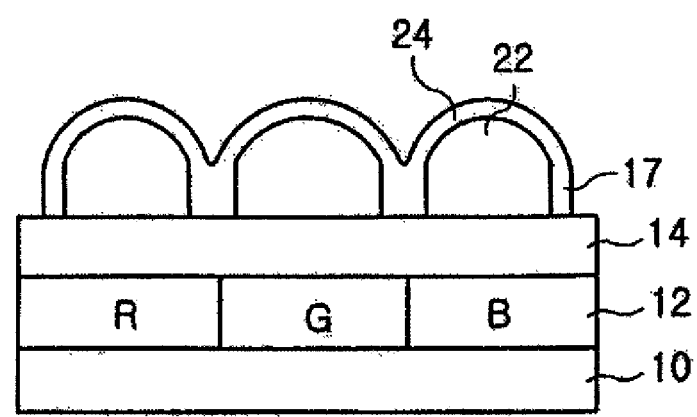

As illustrated in example FIG. 6, in order to minimize the spatial distance or gap between microlenses 22, and more preferably, to remove the gap, a gapless oxide film 24 can be deposited on and/or over barrier rib 17 and microlens 22 and also fill the gaps between each barrier rib 17. Oxide film 24 can be composed of the same material as oxide film 16. Due to oxide film 24, microlens 22 can be formed having a reduced spatial distance or gap therebetween.

A microlens of a CMOS image sensor manufactured in accordance with embodiments can secure the safety of a process and the reproduction of the microlens by evenly forming the curved surface of the microlens. Also, the spatial distance between the microlenses can be minimized to improve the integration of the microlens. Accordingly, the ability of the microlens to condense light incident on the same space is enhanced, making it possible to manufacture a high-efficiency CMOS image sensor. Also, a microlens can be manufactured without a reflow process and a separate exposure process, making it possible to improve manufacturing efficiency.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a color filter array over a semiconductor substrate;
   forming a planarization layer over the color filter array;
   depositing a first oxide film over the planarization layer;
   forming a photoresist pattern on the first oxide film;
   forming a plurality of barrier ribs by etching the first oxide film using the photoresist pattern; and then
   forming a microlens between the barrier ribs,
   wherein forming the microlens comprises:
   injecting a hydrophilic solution in a spatial gap between each barrier rib;
   filling a photoresist in the spatial gap; and then
   evaporating the hydrophilic solution.

2. The method of claim 1, further comprising minimizing a spatial gap between each respective microlens, after forming the microlens.

3. The method of claim 2, wherein minimizing a spatial gap between each respective microlens comprises depositing a second oxide film in the spatial gap between the barrier ribs.

4. The method of claim 3, wherein the deposited second oxide film is connected to the first oxide film.

5. A method comprising:
   forming a thermal resin over a semiconductor substrate;
   forming a color filter array over a semiconductor substrate including the thermal resin;
   forming a planarization layer over the color filter array;
   forming a plurality of barrier ribs spaced by a gap over the planarization layer;
   forming a microlens in a respective gap over the planarization layer; and then
   reducing a spatial gap between respective microlenses,
   wherein forming the microlens comprises:
   injecting a hydrophilic solution in the gap between each barrier rib;
   coating at a constant speed a photoresist in the gap between each barrier rib and over the hydrophilic solution; and then
   performing a baking process which evaporates the hydrophilic solution.

6. The method of claim 5, wherein the color filter array comprises a red color filter, a green color filter and blue color filter.

7. The method of claim 5, wherein forming the plurality of barrier ribs comprises:
   forming a first oxide film over the planarization layer;
   forming a plurality of photoresist patterns over the first oxide film; and then
   etching the first oxide film using the photoresist patterns as masks.

8. The method of claim 7, wherein the first oxide film comprises a low temperature oxide film.

9. The method of claim 8, wherein the low temperature oxide film is formed through TEOS deposition.

10. The method of claim 9, wherein the TEOS deposition includes depositing a $SiO_2$ layer using TEOS through a chemical vapor deposition process.

11. The method of claim 10, wherein the low temperature oxide film is formed with a thickness of about 500 Å and at a temperature below 180° C.

12. The method of claim 5, wherein the hydrophilic solution is injected in vapor form.

13. The method of claim 5, wherein reducing the spatial gap between comprises depositing a second oxide film over the barrier ribs and each microlens and in the gaps between each barrier rib.

14. The method of claim 13, wherein the second oxide film comprises a low temperature oxide film.

15. The method of claim 7, further comprising forming an antireflection coating layer between the first oxide film and the photoresist pattern.

* * * * *